(12) United States Patent
Houston et al.

(10) Patent No.: US 8,211,773 B2
(45) Date of Patent: *Jul. 3, 2012

(54) SRAM CELL WITH ASYMMETRICAL PASS GATE

(75) Inventors: Theodore W. Houston, Richardson, TX (US); Shyh-Horng Yang, Plano, TX (US); Kayvan Sadra, Addison, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/510,666

(22) Filed: Jul. 28, 2009

(65) Prior Publication Data

US 2010/0207183 A1 Aug. 19, 2010

Related U.S. Application Data

(62) Division of application No. 11/238,932, filed on Sep. 29, 2005.

(51) Int. Cl.
*H01L 21/336* (2006.01)

(52) U.S. Cl. ........ 438/286; 438/197; 438/289; 438/290; 438/291; 257/E21.633; 257/E21.618

(58) Field of Classification Search .......... 438/197, 438/289–291, 527, 286; 257/E21.633, E21.618
See application file for complete search history.

(56) References Cited

U.S. PATENT DOCUMENTS

| 5,790,452 | A | 8/1998 | Lien | |
|---|---|---|---|---|
| 6,489,223 | B1 * | 12/2002 | Hook et al. | 438/524 |
| 6,566,204 | B1 * | 5/2003 | Wang et al. | 438/286 |
| 7,053,450 | B2 * | 5/2006 | Kotani | 257/344 |
| 7,192,836 | B1 | 3/2007 | Ghaemmaghami et al. | |
| 7,384,839 | B2 | 6/2008 | Yang et al. | |

FOREIGN PATENT DOCUMENTS

| KR | 2002032043 | | 5/2002 |
|---|---|---|---|
| KR | 2002032043 | A * | 5/2002 |

* cited by examiner

*Primary Examiner* — Kenneth Parker
*Assistant Examiner* — Jose R Diaz
(74) *Attorney, Agent, or Firm* — Rose Alyssa Keagy; Wade J. Brady, III; Frederick J. Telecky, Jr.

(57) ABSTRACT

A method of controlling gate induced drain leakage current of a transistor is disclosed. The method includes forming a dielectric region (516) on a surface of a substrate having a first concentration of a first conductivity type (P-well). A gate region (500) having a length and a width is formed on the dielectric region. Source (512) and drain (504) regions having a second conductivity type (N+) are formed in the substrate on opposite sides of the gate region. A first impurity region (508) having the first conductivity type (P+) is formed adjacent the source. The first impurity region has a second concentration greater than the first concentration.

4 Claims, 13 Drawing Sheets

SRAM CELL WITH ASYMMETRICAL PASS GATE

CROSS-REFERENCE TO NONPROVISIONAL APPLICATION

This is a division of application Ser. No. 11/238,932, filed Sep. 29, 2005, the entire disclosure of which is hereby incorporated by reference.

FIELD OF THE INVENTION

This invention generally relates to electronic circuits, and more specifically to fabrication and structure of field-effect transistors with asymmetrical threshold voltages.

BACKGROUND OF THE INVENTION

The continuing popularity of portable electronic devices presents manufacturers with significant challenges. Increasing capability of electronic devices is moderated by considerations of cost, size, weight, and battery life. These considerations have increasingly resulted in higher levels of semiconductor integration. Thus, portable electronic devices frequently embed memory, control, signal processors, and other circuit functions on a single integrated circuit. Further optimization of these portable electronic devices dictates even greater reduction in geometric feature sizes and spaces between these geometric features. Shrinking feature sizes require lower supply voltages to limit maximum electric fields. Transistor leakage must be minimized to reduce standby current and prolong battery life. Even with lower supply voltages, however, special considerations are required for reliable device operation.

One problem of source/drain resistance was addressed by Yamazaki, U.S. Pat. No. 5,547,888, which is incorporated herein by reference in its entirety. Therein, Yamazaki discloses a disadvantage of symmetrical lightly doped drain (LDD) transistors in a static random access memory (SRAM) cell. Yamazaki discloses that hot carrier reliability only depends on the drain structure and not the source structure. Yamazaki also discloses that a source LDD region may limit on current of the transistor and require a greater channel length. Yamazaki discloses a method of masking the source region of the transistor during the LDD implant to produce an asymmetrical transistor with only a drain LDD implant.

A problem of punch through with short channel lengths was addressed by Wang et al., U.S. Pat. No. 6,566,204, which is incorporated herein by reference in its entirety. Punch through occurs when source and drain depletion regions of a field effect transistor extend across the channel. Under these conditions, the overlying control gate can no longer control current flow between the source and drain. Pocket implants were previously used to locally increase bulk concentration in the channel region of the field effect transistor, thereby limiting depletion region width and resulting punch through. Pocket implants in the drain region, however, limited drive current and increased threshold voltage. Wang et al. disclosed that punch through could be effectively curtailed with an asymmetrical pocket implant adjacent the source of the field effect transistor. Wang et al. further disclose a method of blocking the pocket implant at the drain of the field effect transistor with a mask pattern in close proximity to the control gate of the field effect transistor. The close proximity of the mask pattern selectively blocks the angled pocket implant but permits implantation of source/drain zones without the need for additional masking steps.

Figure 1A:
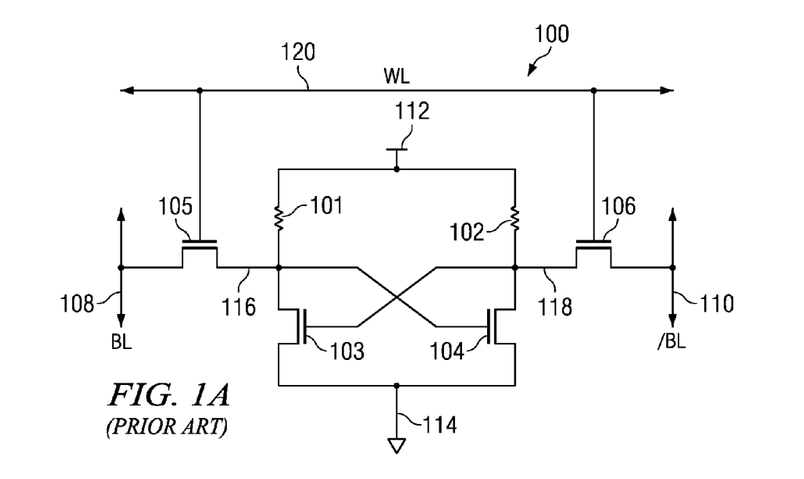
FIG. 1A is a diagram of a static random access memory (SRAM) cell of the prior art.

Lien, U.S. Pat. No. 5,790,452, is incorporated herein by reference in its entirety. Lien applied an angled pocket implant to a static random access memory (SRAM) cell to solve a different problem. Referring to FIG. 1A, there is a schematic diagram of an SRAM cell 100 of the prior art disclosed by Lien as FIG. 2. The SRAM cell includes a latch formed by load resistors 101 and 102 and N-channel drive transistors 103 and 104. The latch is connected between positive supply voltage Vdd 112 and ground or Vss 114. The supply voltage levels Vdd and Vss are also referred to as high and low levels, respectively, for simplicity. Storage nodes 116 and 118 of the latch are connected to bitlines 108 and 110 by access transistors 105 and 106, respectively.

Lien disclosed two conflicting modes of operation of the SRAM cell. During write-disturb mode the SRAM cell of FIG. 1A is not accessed and the wordline 120 is low. Storage nodes 116 and 118 are low and high, respectively, and complementary bitline 110 is low. Under this condition, access transistor 106 has significant subthreshold leakage. Lien discloses a high threshold voltage, therefore, is desirable to limit subthreshold leakage when storage node 118 is high and bitline 110 is low. During read mode bitlines 108 and 110 are both initially high and wordline 120 is high. When the latch storage nodes 116 and 118 are low and high, respectively, Lien discloses an advantage to a low threshold voltage on access transistor 106. This low threshold voltage of access transistor 106 provides a higher voltage at storage node 118 and, therefore, a greater gate voltage at drive transistor 103. Thus, Lien discloses an advantage of a low threshold voltage of access transistor 106 when bitline 110 is positive with respect to storage node 118 in read mode.

Figure 1B:
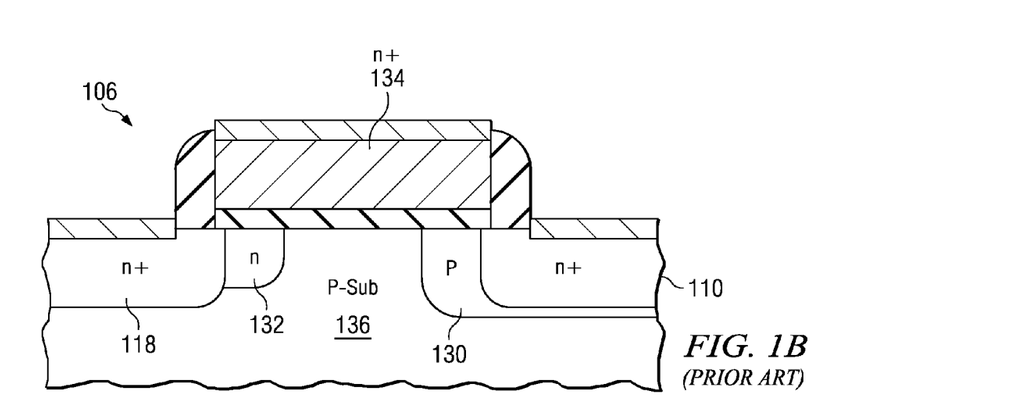
FIG. 1B is a cross sectional view of prior art access transistor 106 of FIG. 1A.

Referring to FIG. 1B, there is a cross section of N-channel access transistor 106 of the prior art as disclosed by Lien at FIG. 3. The access transistor 106 includes N+ source/drain region 118 connected to storage node 118 and N+ source/drain region 110 connected to bitline 110. An N-type lightly doped region 132 extends from N+ source/drain region 118 into the channel region under control gate 134. A P-type pocket implant 130 encloses N+ source/drain region 110. When the N+ drain 118 is positive with respect to N+ source 110, Lien discloses access transistor 106 has a high threshold voltage. Alternatively, when the N+ drain 110 is positive with respect to N+ source 118, access transistor 106 has a low threshold voltage.

SUMMARY OF THE INVENTION

In accordance with a preferred embodiment of the invention, there is disclosed a method of fabricating an SRAM cell with reduced susceptibility to read and write failures. The method comprises fabricating asymmetrical pass transistors in the SRAM cell. The fabrication of asymmetrical pass transistors comprises forming a dielectric region on a surface of a substrate having a first conductivity type. A gate region having a length and a width is formed on the dielectric region. Source and drain extension regions having a second conductivity type are formed in the substrate on opposite sides of the gate region. A first pocket impurity region having a first concentration and the first conductivity type is formed only on the storage-node side of the gate.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Figure 15:
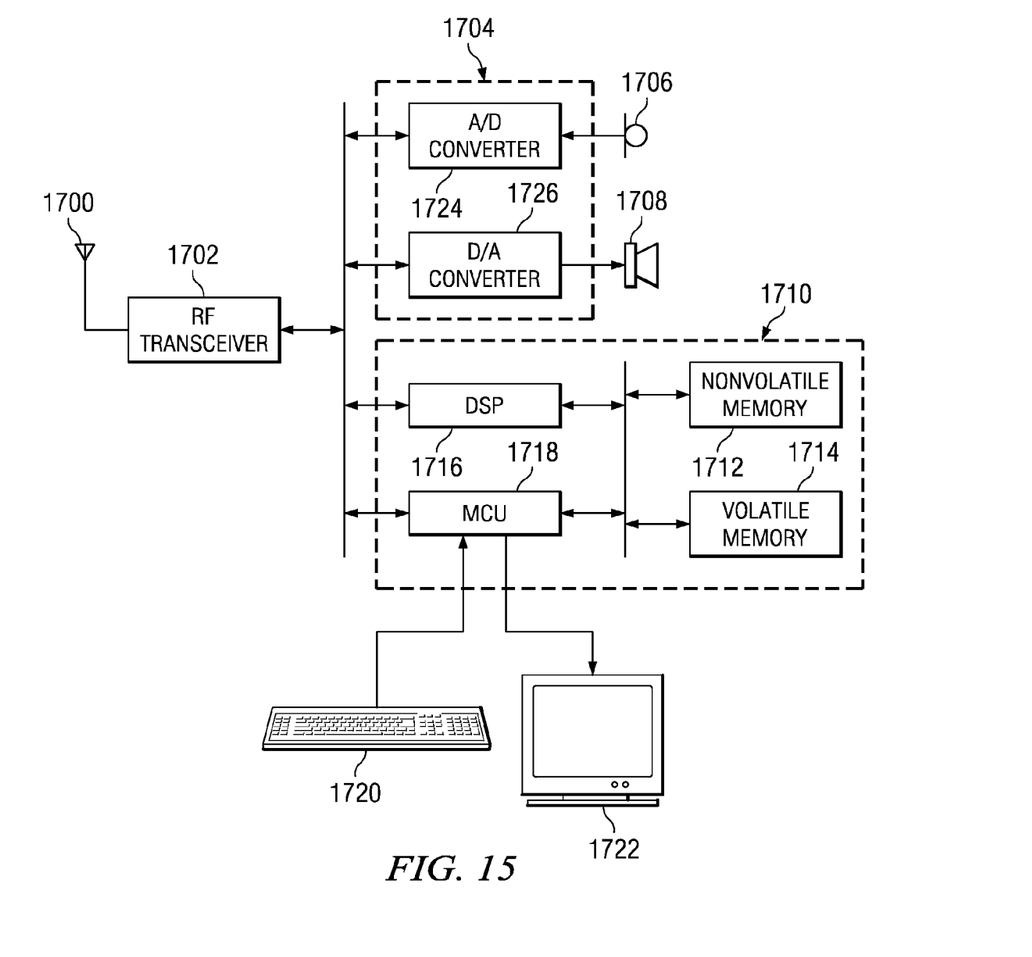
FIG. 15 is a block diagram of a wireless telephone as an example of a portable electronic device which could advantageously employ the present invention.

Referring to FIG. 15, there is a block diagram of a wireless telephone as an example of a portable electronic device which could advantageously employ this invention. The wireless telephone includes antenna 1700, radio frequency transceiver 1702, baseband circuits 1710, microphone 1706, speaker 1708, keypad 1720, and display 1722. The wireless telephone is preferably powered by a rechargeable battery (not shown) as is well known in the art. Antenna 1700 permits the wireless telephone to interact with the radio frequency environment for wireless telephony in a manner known in the art. Radio frequency transceiver 1702 both transmits and receives radio frequency signals via antenna 1702. The transmitted signals are modulated by the voice/data output signals received from baseband circuits 1710. The received signals are demodulated and supplied to baseband circuits 1710 as voice/data input signals. An analog section 1704 includes an analog to digital converter 1724 connected to microphone 1706 to receive analog voice signals. The analog to digital converter 1724 converts these analog voice signals to digital data and applies them to digital signal processor 1716. Analog section 1704 also includes a digital to analog converter 1726 connected to speaker 1708. Speaker 1708 provides the voice output to the user. Digital section 1710 is embodied in one or more integrated circuits and includes a microcontroller unit 1718, a digital signal processor 1716, nonvolatile memory circuit 1712, and volatile memory circuit 1714. Nonvolatile memory circuit 1712 may include read only memory (ROM), ferroelectric memory (FeRAM), FLASH memory, or other nonvolatile memory as known in the art. Volatile memory circuit 1714 may include dynamic random access memory (DRAM), static random access memory (SRAM), or other volatile memory circuits as known in the art. Microcontroller unit 1718 interacts with keypad 1720 to receive telephone number inputs and control inputs from the user. Microcontroller unit 1718 supplies the drive function to display 1722 to display numbers dialed, the current state of the telephone such as battery life remaining, and received alphanumeric messages. Digital signal processor 1716 provides real time signal processing for transmit encoding, receive decoding, error detection and correction, echo cancellation, voice band filtering, etc. Both microcontroller unit 1718 and digital signal processor 1716 interface with nonvolatile memory circuit 1712 for program instructions and user profile data. Microcontroller unit 1718 and digital signal processor 1716 also interface with volatile memory circuit 1714 for signal processing, voice recognition processing, and other applications.

Figure 2:
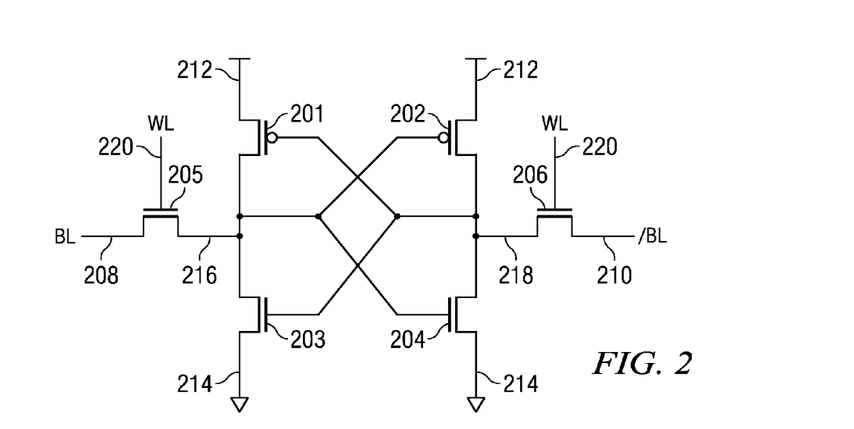
FIG. 2 is a schematic diagram of a six-transistor static random access memory cell that may advantageously use the present invention.
Figure 3:
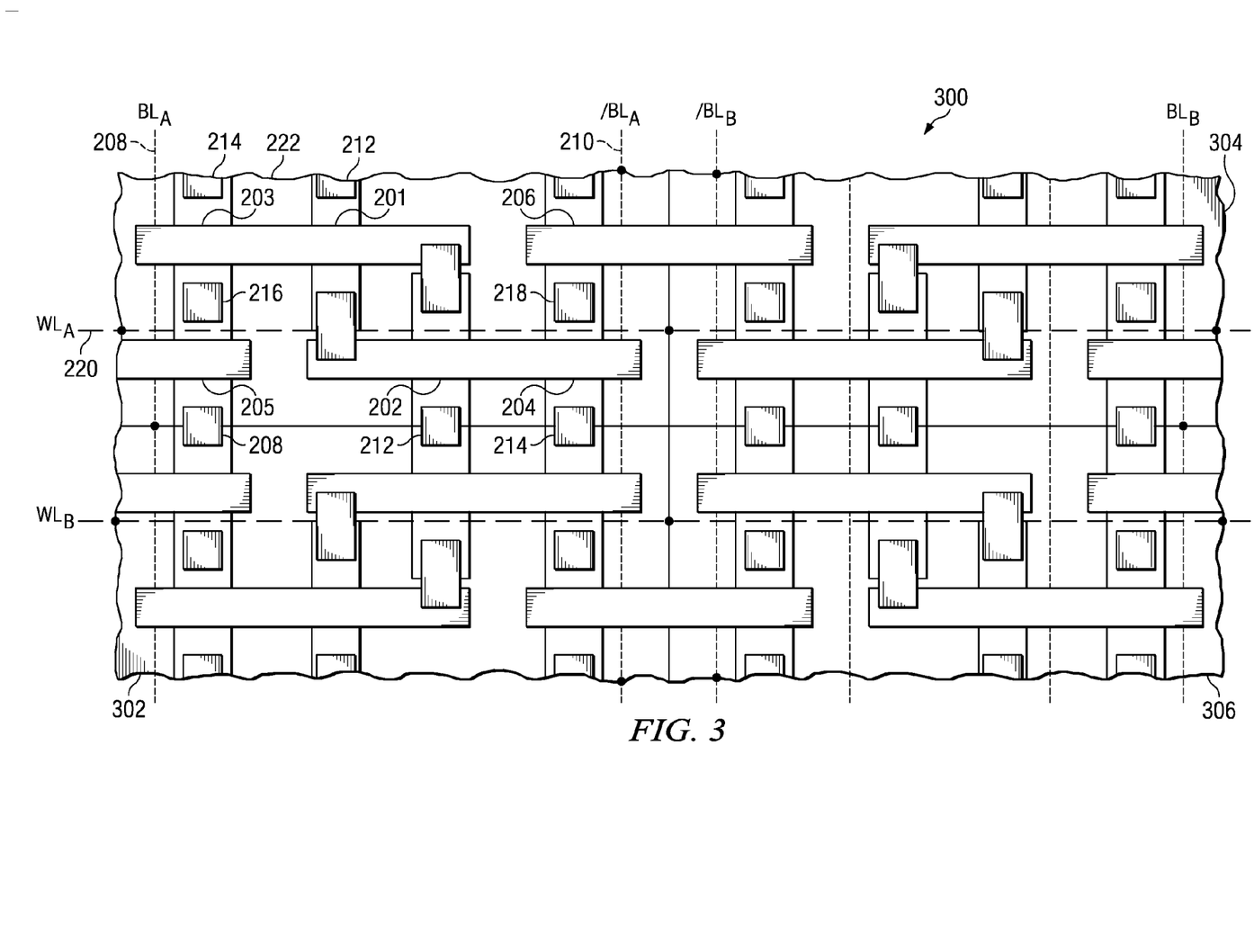
FIG. 3 is a layout diagram of an array of four memory cells as in FIG. 2.

Turning now to FIG. 2, the electrical circuit corresponding to exemplary memory cell 300 of FIG. 3 will be explained in detail. Each of the four memory cells 300-306 of FIG. 3 is electrically identical to the schematic diagram of FIG. 2. Moreover, the geometric layout of each memory cell of FIG. 3 is substantially identical except that they may be placed in different views. Memory cell 300 is bounded to the right and below by memory cells 304 and 302, respectively, as indicated by the solid line cell boundaries. Memory cell 300 includes a latch formed by P-channel transistors 201 and 202 and N-channel transistors 203 and 204. These transistors are indicated by polycrystalline silicon gate regions crossing an active region. Source terminals of P-channel transistors 201 and 202 are connected to positive Vdd supply voltage in metal (not shown) at metal-to-P+ contact areas 212. Likewise, source terminals of N-channel transistors 203 and 204 are connected to ground or Vss supply voltage in metal (not shown) at metal-to-N+ contact areas 214. Each of the metal-to-silicon contact areas 212 and 214 is formed by a half contact in each of two adjacent cells. Storage nodes 216 and 218 are output terminals of the latch as indicated at FIG. 3 by metal-to-N+ contact areas. The connection of the drain of transistor 203 and drain of transistor 201 comprising storage node 216 is made through metal and is not shown in this figure for clarity. Similarly, the connection of the drain of transistor 204 and drain of transistor 202 comprising storage node 218 is made through metal and is not shown. These storage nodes 216 and 218 are connected to access (sometimes referred to as "pass") N-channel transistors 205 and 206, respectively. Gates of the N-channel transistors 205 and 206 are connected to word line 220 indicated by a dashed line. The other terminals of N-channel transistors 205 and 206 are connected to bit line $BL_A$ 208 and complementary bit line/$BL_A$ 210 indicated by dotted lines, respectively.

Decreasing feature sizes of present process technology make the memory cell of FIGS. 2 and 3 particularly susceptible to read and write failures. These failures are often caused by random doping fluctuation of individual memory cell transistors. Such random doping fluctuations can significantly affect threshold voltage, channel length, and other parameters. The problem is especially significant, because most steps to decrease read failures will increase write failures. Referring to FIG. 2, read failures occur, for example, when bitline BL 208 and complementary bitline/BL 210 are initially precharged high and storage nodes 216 and 218 are latched high and low, respectively. Wordline WL 220 goes high, thereby turning on N-channel access transistors 205 and 206. Current, referred to as read current, flows through transistors 204 and 206, which are connected in series between/ BL 210 and VSS 214, to discharge/BL 210. While this current is flowing, the voltage on storage node 218 will rise above VSS, with the amount of the initial rise dependent on the relative conductivity of transistors 204 and 206. The more conductive 206 is relative to 204, the higher the voltage on storage node 218. If the voltage on 218 rises sufficiently to start to turn on transistor 203, the voltage on storage node 216 will be lowered, which in turn will decrease the conductivity of 204 and cause a further increase in the voltage of storage node 218. As the voltage of storage node 218 rises and the voltage of storage node 216 falls, an imbalance in the memory cell, for example due to random doping fluctuations, may cause the cell to reverse logic states, thereby producing a read error.

Memory cell designs often decrease the ratio of access transistor 206 drive strength with respect to drive transistor 204 drive strength to decrease read errors. This decreased ratio of drive strengths makes access transistor 206 relatively more resistive with respect to drive transistor 204. The high level coupling of storage node 218, therefore, is decreased and a greater voltage difference is maintained between storage nodes 216 and 218. This decreased ratio, however, may increase write failures. During a write cycle where the data state of the memory cell is reversed, bitline BL 208 and complementary bitline/BL 210 are driven to opposite data states from respective storage nodes 216 and 218. If storage nodes 216 and 218 are high and low, for example, then bitline BL 208 and complementary bitline/BL 210 are low and high, respectively. The low level of bitline BL 208 is a source, and the high level of storage node 216 is a drain of access transistor 205. The low level of bitline BL 208 must override the high level of storage node 216 in a brief period of time to complete the write operation. Thus, an increased drive strength ratio of access transistor 208 to load transistor 201 is desirable.

The present invention solves these problems of read and write errors by fabricating access transistors 205 and 206 (also called "pass transistors") with asymmetrical threshold voltages. During a read operation as previously described, complementary bitline terminal/BL 210 is positive with respect to storage node 218. Therefore, complementary bitline terminal/BL 210 is the drain terminal and storage node 218 is the source terminal of access transistor 206. In this condition, a higher threshold voltage of access transistor 206 produces the desired decrease in drive strength ratio with respect to drive transistor 204. This higher threshold voltage is produced by a P-type pocket implant adjacent storage nodes 216 and 218 of the respective sources of N-channel access transistors 205 and 206. In contrast to a read operation, storage node 216 is positive with respect to bitline BL 208 in a write operation as previously described. Therefore, bitline terminal BL 208 is the source terminal and storage node 216 is the drain terminal of access transistor 205. In this condition, a lower threshold voltage of access transistor 205 produces the desired increase in drive strength ratio with respect to load transistor 201. This lower threshold voltage is produced by blocking the P-type pocket implant adjacent bitline BL 208 and complementary bitline/BL 210 terminals of respective N-channel access transistors 205 and 206.

Figure 4A:
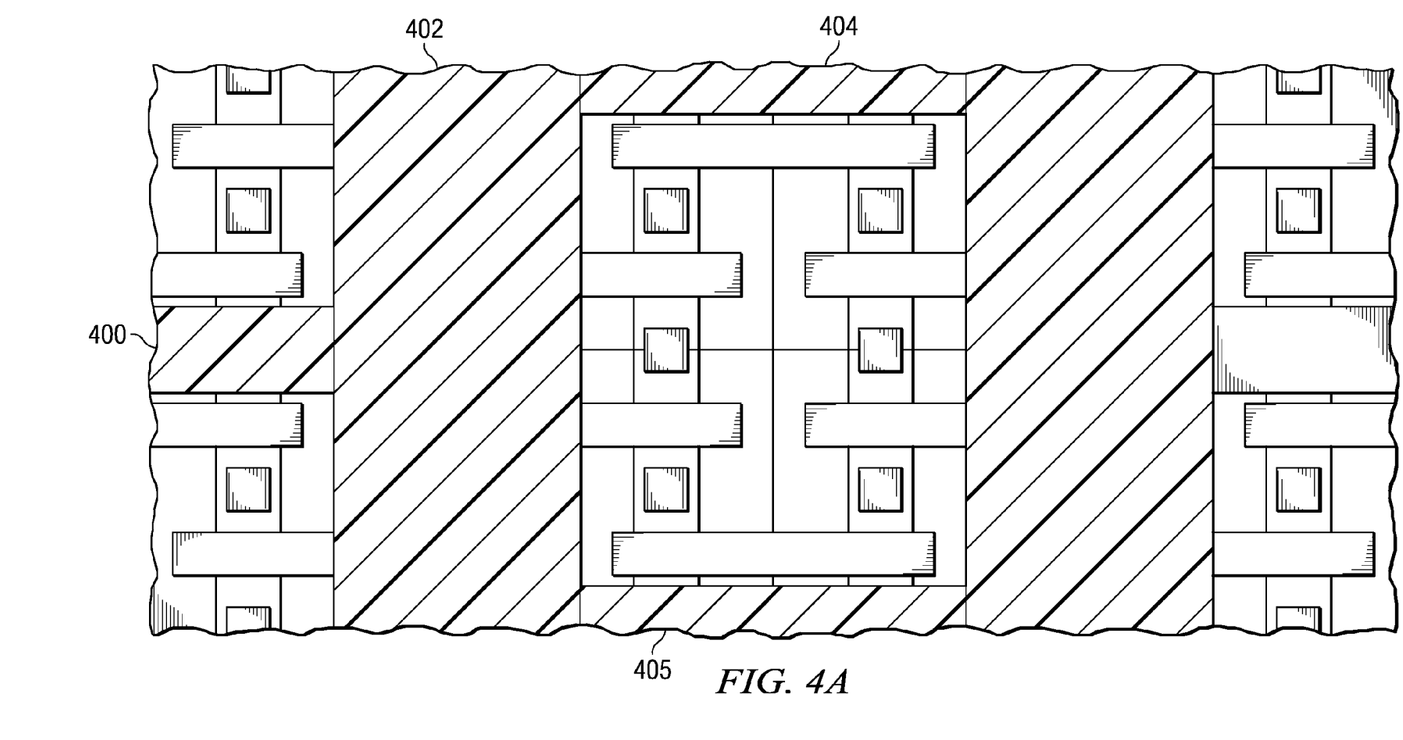
FIG. 4A is a layout diagram of the array of four memory cells of FIG. 2 with an N-channel implant mask.
Figure 4B:
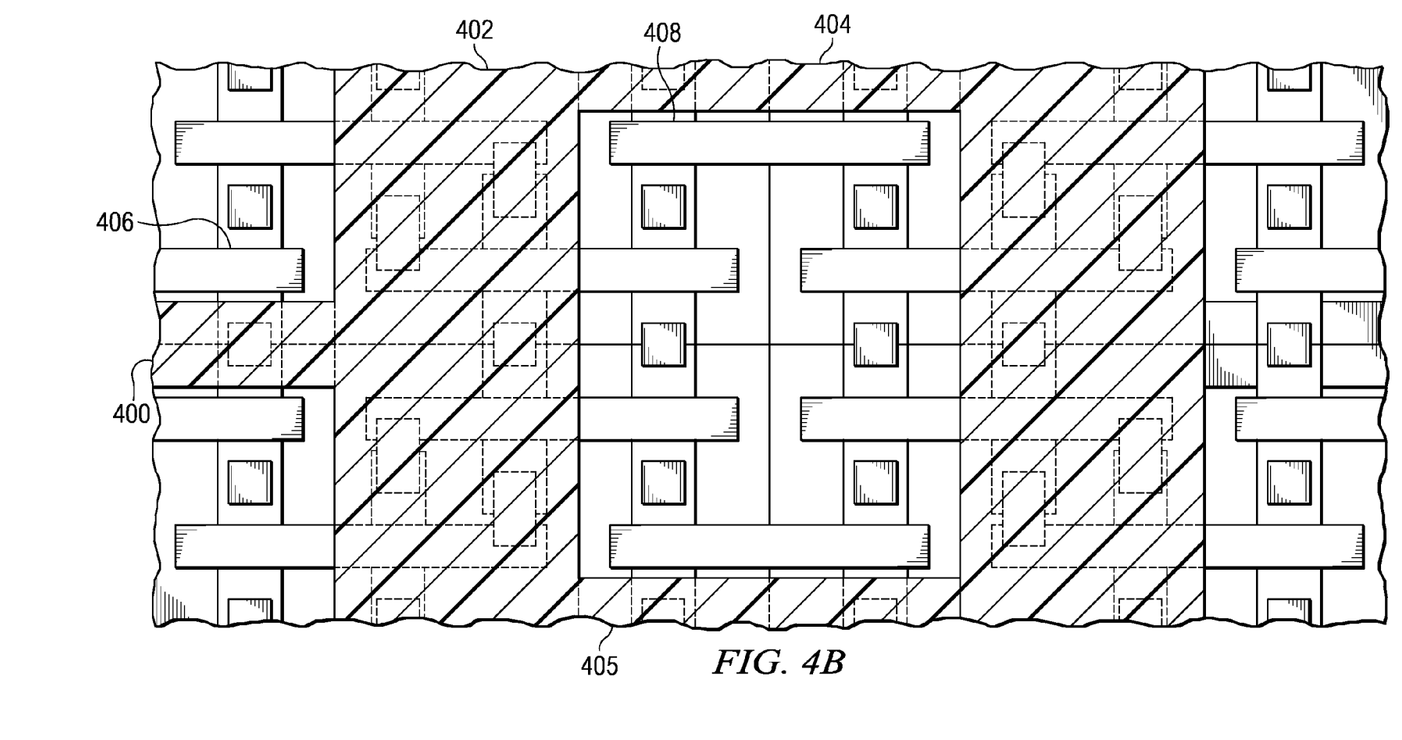
FIG. 4B is the layout diagram of FIG. 4A showing features under the implant mask for clarity.

Turning now to FIG. 4A, there is a layout diagram of the array of four memory cells of FIG. 2 with an N-channel implant mask formed by photoresist. The mask includes portion 402, which covers P-channel load transistors 201 and 202, and portions 400, 404, and 405, formed between adjacent N-channel access transistors (also called 'pass transistors'). FIG. 4B is the layout diagram of FIG. 4A showing the outline of the implant mask (that is located over the cell geometries shown in FIG. 3) for clarity. Mask portions 400 and 404 are adjacent and spaced apart from access transistor gate edges 406 and 408, respectively. The space between each mask portion and the respective adjacent gate edge allows a lightly doped N-type ion implant with a small or zero tilt angle to produce lightly doped source and drain extension regions on each access transistor. In subsequent thermal steps, the implanted species diffuse to make an electrical connection to the heavily doped source and drain regions farther away from the gate. The closely spaced photoresist portions 400 and 404 block access transistor gate edges 406 and 408, respectively, from receiving angled P-type pocket implants as will be explained in detail. Thus, the asymmetrical P-type pocket implant and the lightly doped source and drain extension implants may be performed without an extra photoresist mask step according to the embodiment of FIG. 4B.

Figure 5A:
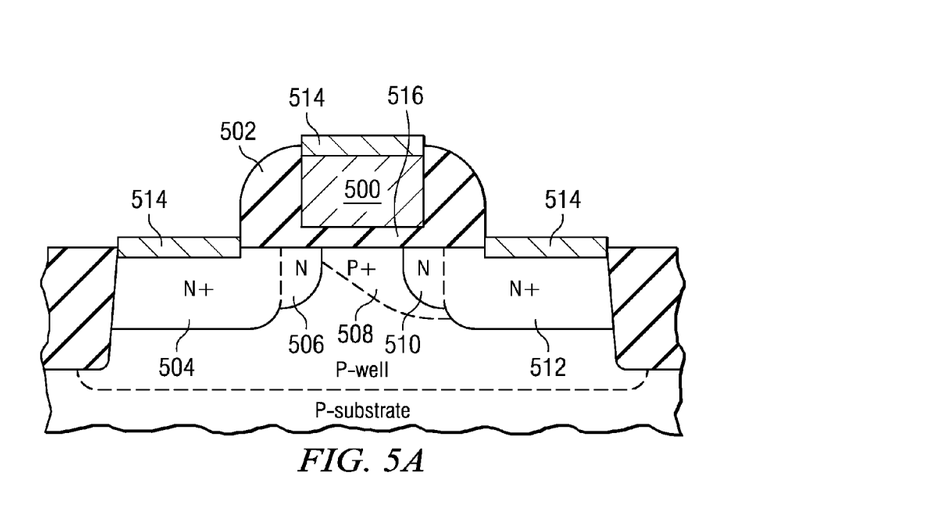
FIG. 5A is cross section of an N-channel transistor showing a pocket implant of the present invention.

Referring now to FIG. 5A, there is a cross section of an N-channel transistor access transistor showing N-type lightly doped source and drain extension implants and a P-type pocket implant of the present invention. The access transistor is formed on a P-substrate within a P-well region. Drain region 504 corresponds to bitline terminal BL 208 and complementary bitline terminal/BL 210 of respective access transistors 205 and 206. Source region 512 corresponds to storage node terminals 216 and 218 of respective access transistors 205 and 206. Gate region 500 corresponds to wordline terminal WL 220. Each of the drain, source, and gate regions are preferably clad with a metal silicide layer 514 separated by sidewall dielectric regions 502. A lightly doped drain extension implant 506 is formed adjacent drain region 504. A lightly doped source extension implant 510 is formed adjacent source region 512. A P-type pocket implant 508 is formed adjacent the lightly doped source extension implant 510. The asymmetrical pocket implant advantageously provides a first threshold voltage when the storage node 512 is positive with respect to the bitline terminal 504 and a second threshold voltage of a greater magnitude than the first threshold voltage when the storage node 512 is negative with respect to the bitline terminal 504. The first threshold voltage provides a low trip voltage for the memory cell during a write operation by increasing the drive strength of the access transistor, for example, access transistor 205 with respect to corresponding load transistor 201. The second threshold voltage has a greater magnitude than the first threshold voltage and reduces positive coupling to a low storage node, for example, storage node 218 during a read operation.

Figure 5B:
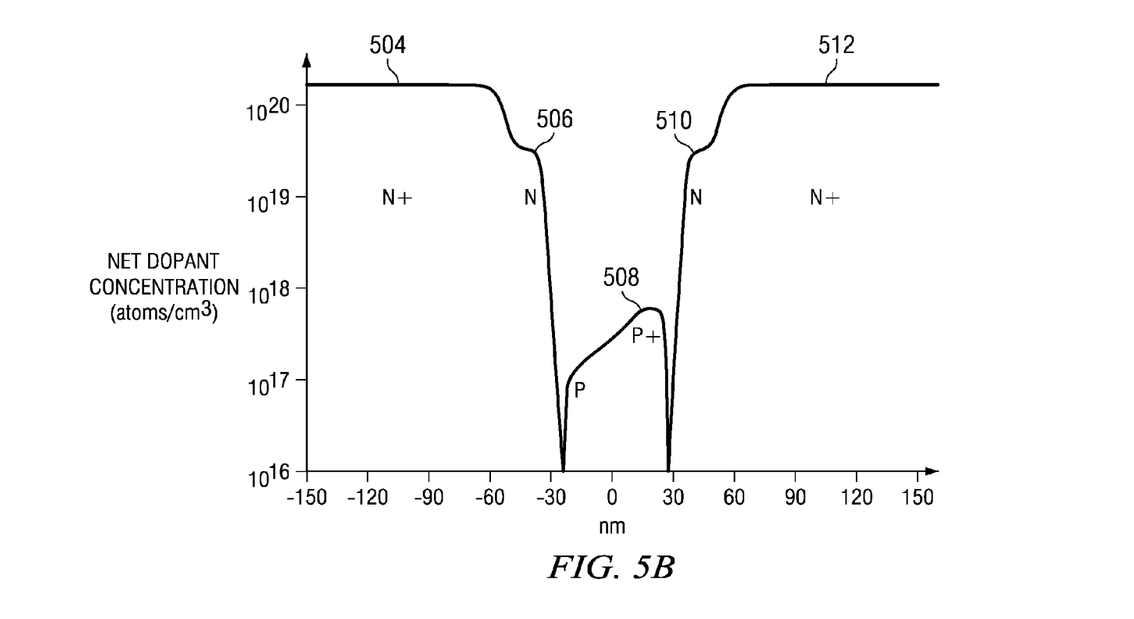
FIG. 5B is a drain-to-source surface concentration profile of the transistor of FIG. 5A.

FIG. 5B is a surface concentration profile of the access transistor of FIG. 5A and includes the same reference numerals for the same features. The center of the channel region is taken as the origin for the horizontal axis. The vertical axis is the net dopant concentration at the semiconductor surface of the access transistor of FIG. 5A. Drain and source regions 504 and 512 and lightly doped extension regions 506 and 510 are preferably formed from implanted Arsenic, Phosphorus, or other suitable N-type impurities. The P-type pocket implant 508 is preferably formed from implanted Boron or other suitable P-type impurity. The P-type pocket implant 508 extends from the storage node or lightly doped source region 510 to the bitline or lightly doped drain region 506. However, the net P+ concentration adjacent the lightly doped source region 510 is approximately an order of magnitude greater than the P concentration adjacent the lightly doped drain region 506. The asymmetrical P+ pocket implant adjacent lightly doped source region 510 requires a greater gate voltage to produce an inversion layer under gate region 500 when drain region 506 is positive with respect to source region 510 than source region 510 is positive with respect to drain region 506. In one embodiment of the present invention, this difference in threshold voltages may be approximately 100 mV. This asymmetrical threshold voltage of the N-channel access transistor advantageously improves read and write operations as previously discussed.

Figure 6:
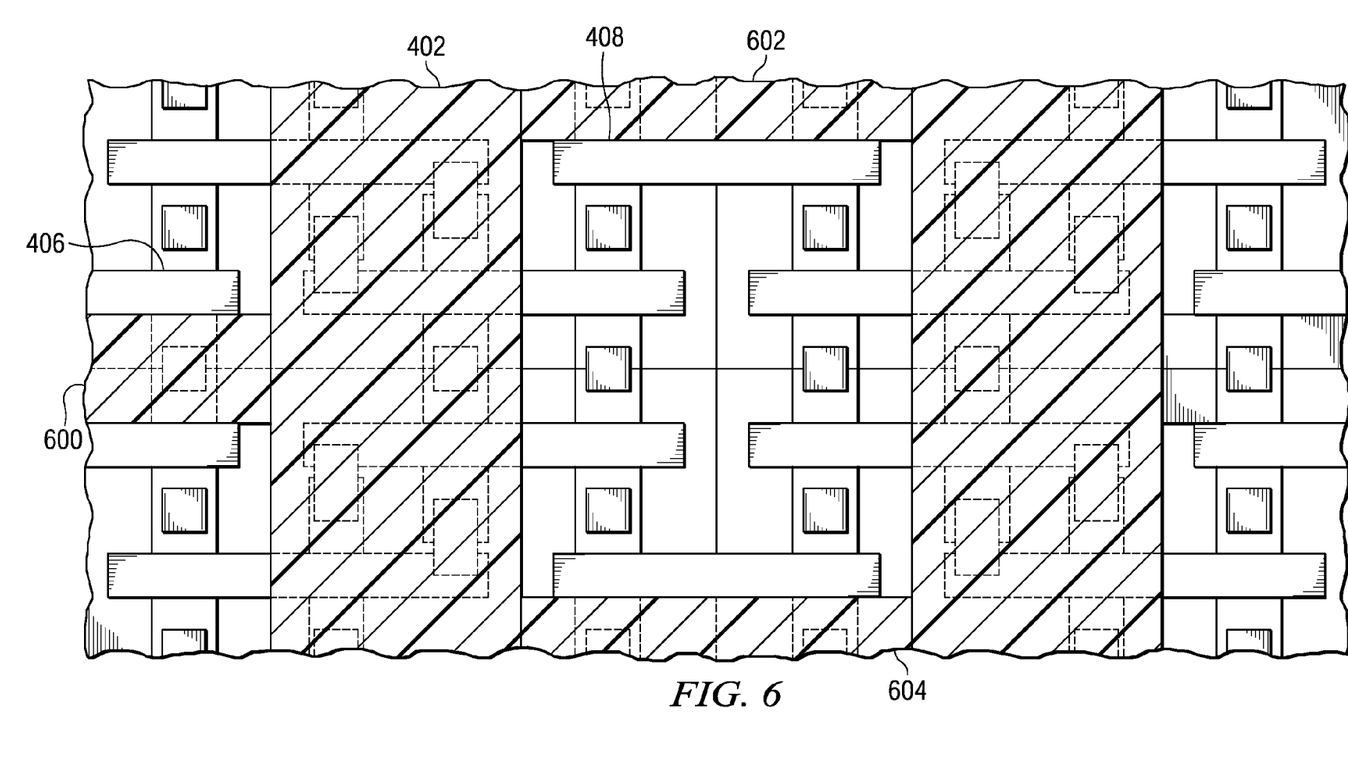
FIG. 6 is another embodiment of the layout diagram of FIG. 4B.

Turning now to FIG. 6, there is another embodiment of the layout diagram of FIG. 4B. The photoresist mask outline is shown over the memory cell geometries for clarity. Photoresist mask portion 402 covers P-channel transistors 201 and 202 (FIGS. 2-3) as previously discussed. The widths of photoresist mask portions 600, 602, and 604 have been increased relative to FIG. 4B. Thus, access transistor gate edges 406 and 408 are coincident with photoresist mask edges 600 and 602, respectively. This embodiment completely blocks a P-type pocket implant from the bitline terminal side of an access transistor at edges 406 and 408 while permitting the implant at the opposite edges. However, due to the absence of any clearance between the resist edge and the gate edge, if this photoresist mask is used for the lightly doped source and drain extension implant, the light doped extension implant will also be blocked. As a result, this embodiment requires that the pocket implant be performed with the photoresist mask of FIG. 6, and the lightly doped source and drain extension implants be performed with another photoresist mask wherein portions 400, 402, and 406 are either narrow as in FIG. 4B or not present at all. This embodiment may be advantageously used in a fabrication process where a threshold voltage adjust photoresist mask that is not common to the lightly doped source and drain implant is available. Thus, the asymmetrical P-type pocket implant may be performed using the threshold voltage adjust mask and without an extra photoresist mask step.

Figure 7:
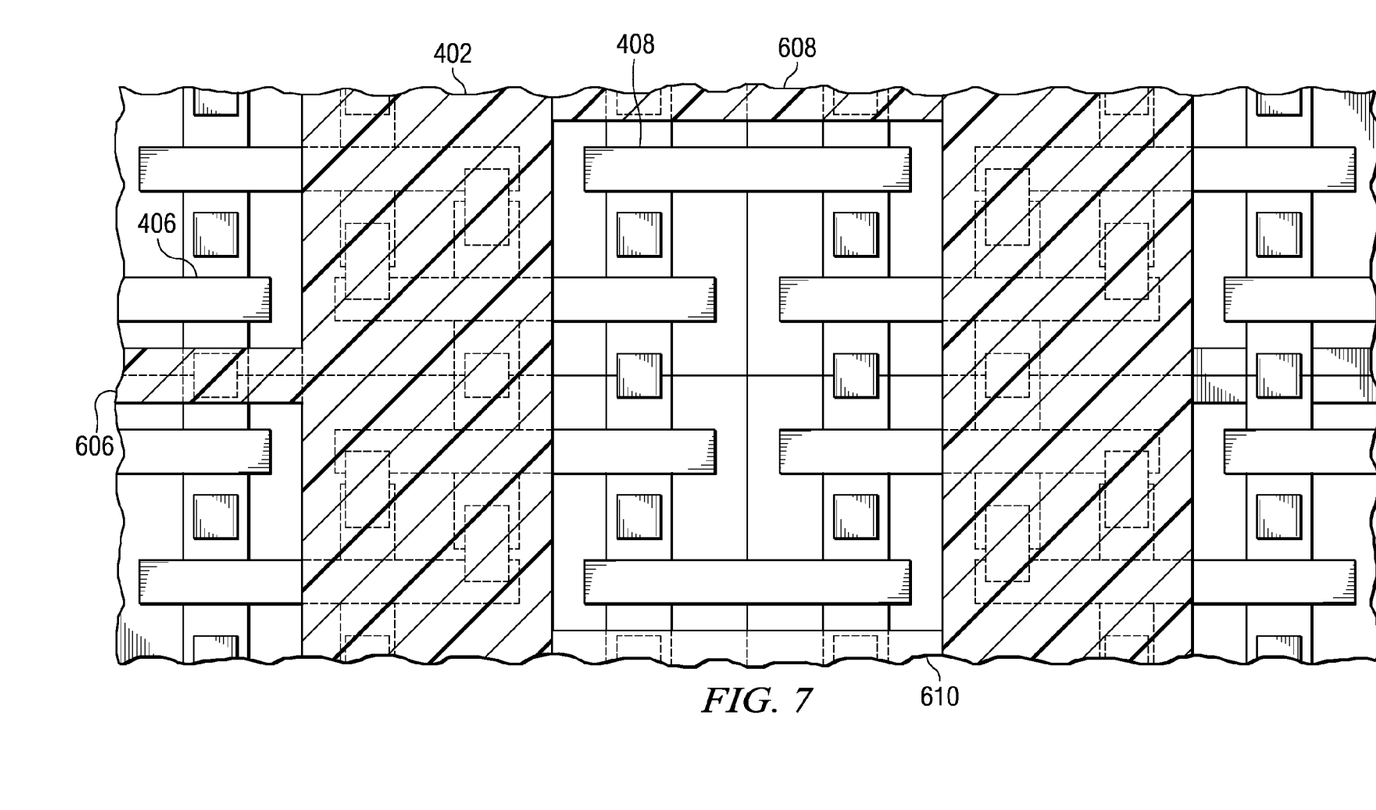
FIG. 7 is yet another embodiment of the layout diagram of FIG. 4B.

FIG. 7 is yet another embodiment of the layout diagram of FIG. 4B. Photoresist mask portion 402 covers P-channel transistors 201 and 202 (FIG. 2) as previously discussed. The widths of photoresist mask portions 606, 608, and 610 have been decreased relative to FIG. 4B. This decrease in photoresist mask width provides greater space between the access transistor edges 406 and 408 and photoresist mask regions 606 and 608, respectively. This embodiment advantageously produces a larger clearance for the lightly doped source and drain extension implants to enter the substrate adjacent both sides of the access transistor gate. The narrow photoresist mask regions are limited by manufacturing capability. However, relatively narrower photoresist mask regions 606 and 608 are possible when connected to wider photoresist mask regions such as region 402. Thus, the asymmetrical P-type pocket implant and the lightly doped source and drain implants may be performed without an extra photoresist mask step according to the present embodiment.

Figures 8A, 8B:
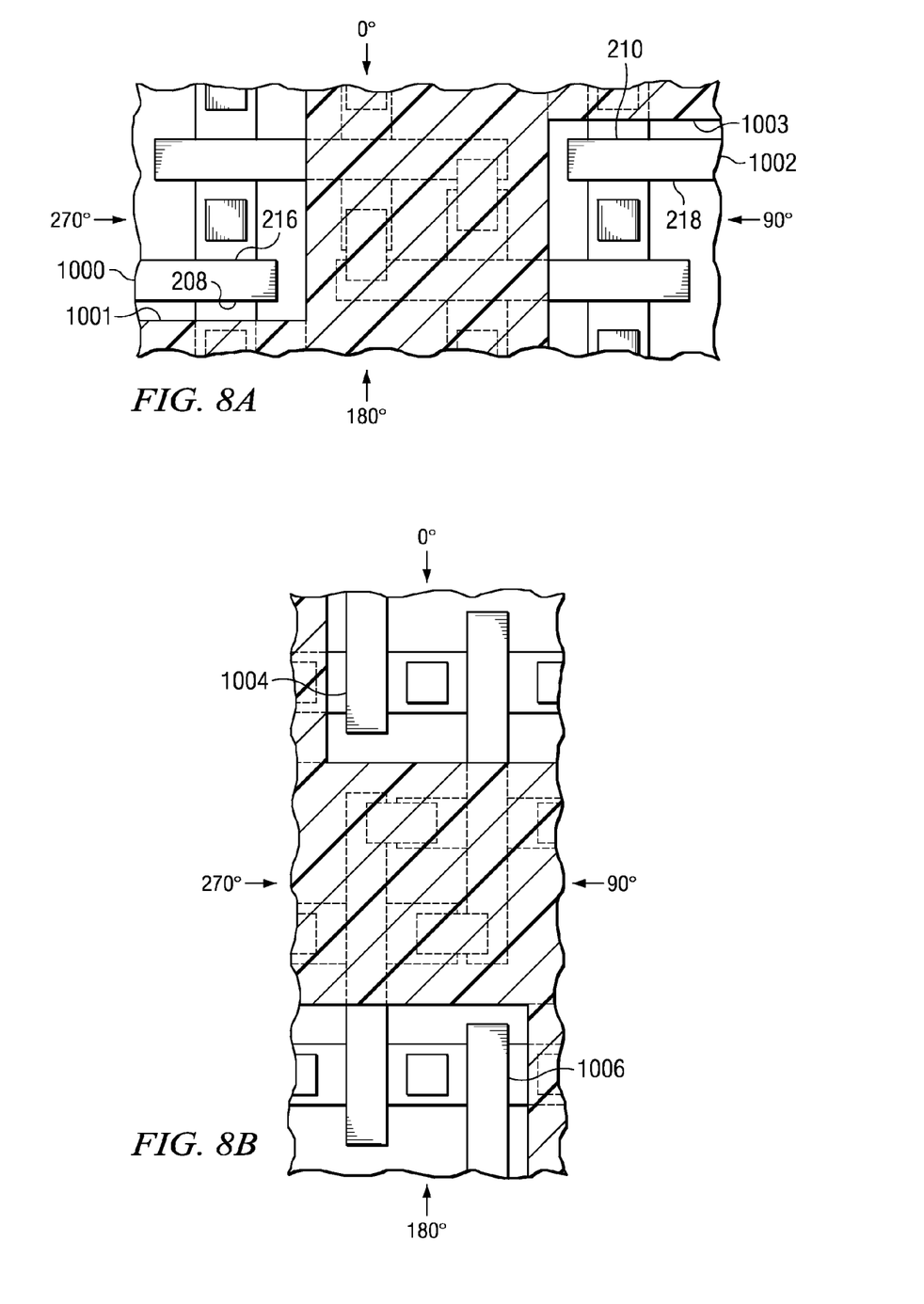
FIG. 8A is a layout diagram of a memory cell as in FIG. 2 in horizontal orientation showing the effect of implant azimuth angles on N-channel access transistors.
FIG. 8B is a layout diagram of a memory cell as in FIG. 2 in vertical orientation showing the effect of implant azimuth angles on N-channel access transistors.

Turning now to FIG. 8A, there is a layout diagram of a memory cell as in FIG. 3 in horizontal orientation showing the effect of implant azimuth angles on N-channel access transistors 1000 and 1002. N-channel access transistor 1000 is adjacent photoresist mask edge 1001. N-channel access transistor 1002 is adjacent photoresist mask edge 1003. In one embodiment of the present invention, pocket implants are applied at four azimuth angles of 0°, 90°, 180°, and 270°. In this embodiment 90° and 270° azimuth pocket implants will enter the substrate on both sides of the access transistors 1000 and 1002, and will therefore not create any asymmetry. The 0° and 180° azimuths create the asymmetry as follows. The 0° implant enters the storage-node side 216 of the access transistor 1000 and is blocked from the bitline side 210 of the access transistor 1002. Likewise, the 180° implant enters the storage node side 218 of the pass transistor 1002 and is blocked from the bitline side 208 of the access transistor 1000. Thus, both N-channel access transistors 1000 and 1002 advantageously receive asymmetrical P-type pocket implants. This four-azimuth embodiment also creates asymmetrical access transistors for memory cells placed in the orientation shown in FIG. 8B, where the 0° and 180° azimuth implants enter both sides of the pass transistors and the 90° and 270° azimuth implants generate the asymmetry. In this embodiment, the lightly doped source and drain extension implants are applied either at zero tilt or at a small tilt angle preferably smaller than 7°, thus entering the substrate on all sides of the access transistors. Alternatively, they can be implanted using a separate photoresist mask as described before. If none of these alternatives is adopted, some asymmetry in lightly doped source and drain extensions will also occur, which may be acceptable in certain conditions.

In another embodiment of the present invention, pocket implants are applied at only two azimuth angles. Referring to FIG. 8A, pocket implants are applied only at the 0° and 180° azimuths. The advantage of this embodiment is that greater asymmetry is achieved since the pocket implants at 90° and 270°, which would enter the substrate on both sides of the access transistors, are no longer present. If the SRAM cells follow the orientation of FIG. 8B, however, the pocket implants must be applied at the 90° and 270° azimuths. As a result, the disadvantage of this embodiment is that all SRAM cells must be placed in the same orientation on the chip. In this embodiment, lightly doped source and drain extension implants are applied either at zero tilt, or at a small tilt angle preferably smaller than 7°, or applied at any tilt angle at the 90° and 270° azimuths, thus entering the substrate on all sides of the access transistors. Alternatively, they can be implanted using a separate photoresist mask as described before.

Figure 9A:
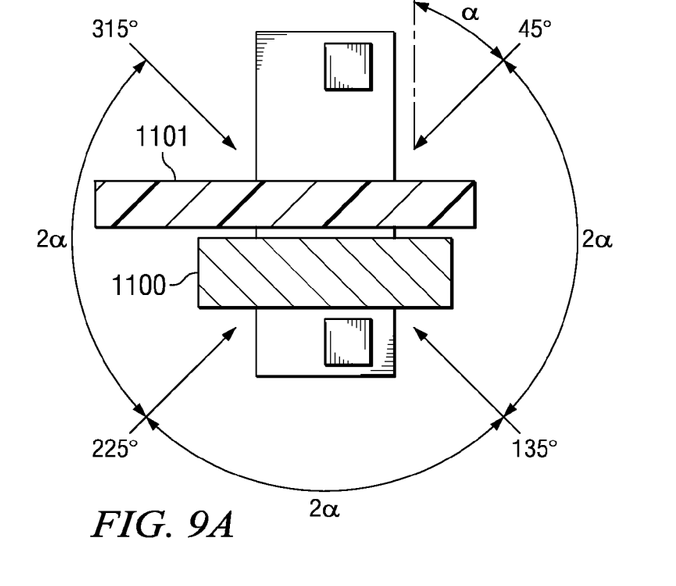
FIG. 9A is a layout diagram of a transistor in horizontal orientation showing the effect of implant azimuth angles rotated by 45 degrees with respect to FIG. 10A.
Figure 9B:
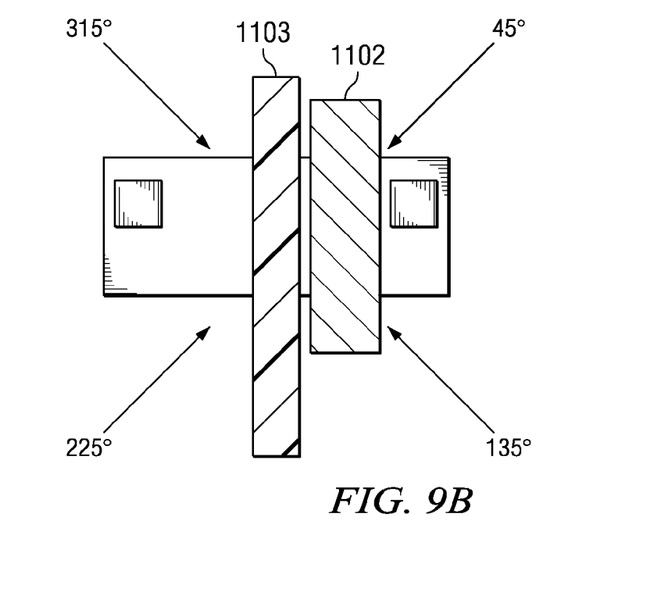
FIG. 9B is a layout diagram of a transistor in vertical orientation showing the effect of implant azimuth angles rotated by 45 degrees with respect to FIG. 10A.

In another embodiment of the present invention, the pocket implants are applied at four azimuths of 45°, 135°, 225°, and 315°. Referring now to FIG. 9A, there is a layout diagram of transistor 1100 in horizontal orientation showing the effect of implant azimuth angles rotated by 45 degrees with respect to FIG. 8A. For this cell orientation, the gate of transistor 1100 blocks the P-type pocket implant between the gate and photoresist mask 1101 for 135° and 225° azimuth angles. Likewise, the photoresist mask edge 1101 blocks the P-type pocket implant between the gate and photoresist mask 1101 for 45° and 315° azimuth angles. The P-type pocket implant, however, is applied to the opposite side of transistor 1100 by 45° and 315° azimuth angles. FIG. 9B is a layout diagram of transistor 1102 in vertical orientation showing the effect of implant azimuth angles rotated by 45 degrees with respect to FIG. 8A. For the vertical cell orientation, the gate of transistor 1102 blocks the P-type pocket implant between the gate and photoresist mask 1103 for 45° and 135° azimuth angles. Likewise, the photoresist mask edge of photoresist mask 1103 blocks the P-type pocket implant between the gate and photoresist mask 1103 for 225° and 315° azimuth angles. The P-type pocket implant, however, is applied to the opposite side of transistor 1102 by 225° and 315° azimuth angles. Thus, a rotation of azimuth implant angles by 45° degrees with respect to FIG. 8A advantageously eliminates cell orientation dependence. In this embodiment, the lightly doped source and drain extension implants are applied either at zero tilt or at a small tilt angle preferably smaller than 7°, thus entering the substrate on all sides of the pass transistors. If they are tilted, they can be implanted at any set of azimuth angles, including 0, 90, 180, and 270, or 45, 135, 225, and 215. Alternatively, they can be implanted using a separate photoresist mask as described before. If none of these alternatives is adopted, some asymmetry in lightly doped source and drain extensions may occur in this case, which may be acceptable in certain conditions.

Figure 10A:
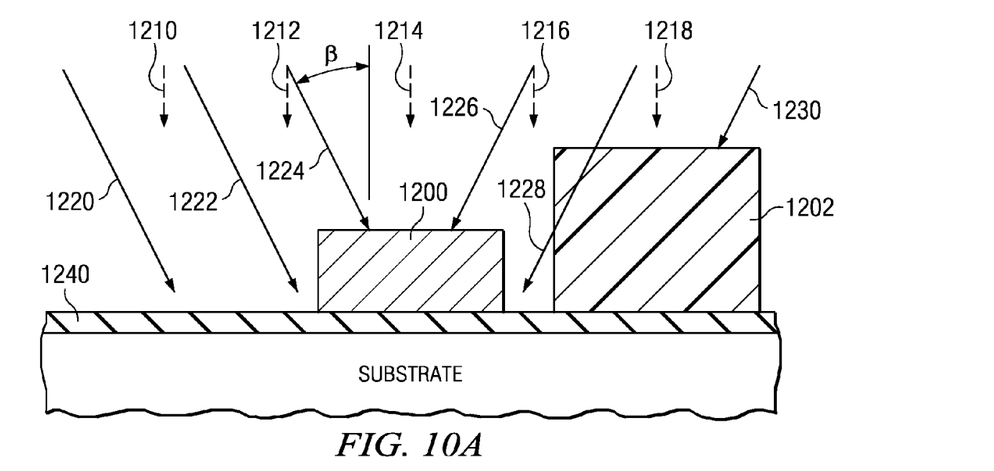
FIG. 10A is an exemplary cross section diagram showing the effect of implant tilt angle for an edge of a single transistor.

Referring to FIG. 10A, there is an exemplary cross section diagram showing the effect of implant tilt angle for an edge of a single transistor. The transistor includes gate region 1200 formed over gate dielectric 1240. A photoresist mask 1202 is closely spaced from the gate region 1200 to block a P-type pocket implant in the area there between. An LDD implant, indicated by dashed arrows 1210-1218, is applied with vertical or 0° tilt angle. Alternatively, the LDD implant may be applied at a substantially vertical tilt angle of preferably less than 7° with the same result. In this manner, the LDD implant is applied equally to both source and drain edges of the transistor, as long as there is enough clearance between the gate and the photoresist to allow the LDD implant to enter the substrate. A P-type pocket implant, indicated by solid arrows 1220-1230, is applied with tilt angle of plus or minus β with respect to vertical as shown. In this manner, the P-type pocket implant 1220-1224 is applied to the left side of the transistor but blocked from the right side by transistor gate 1200. The P-type pocket implant 1226-1230 is also blocked from the right side of the transistor by photoresist mask 1202.

Figure 10B:
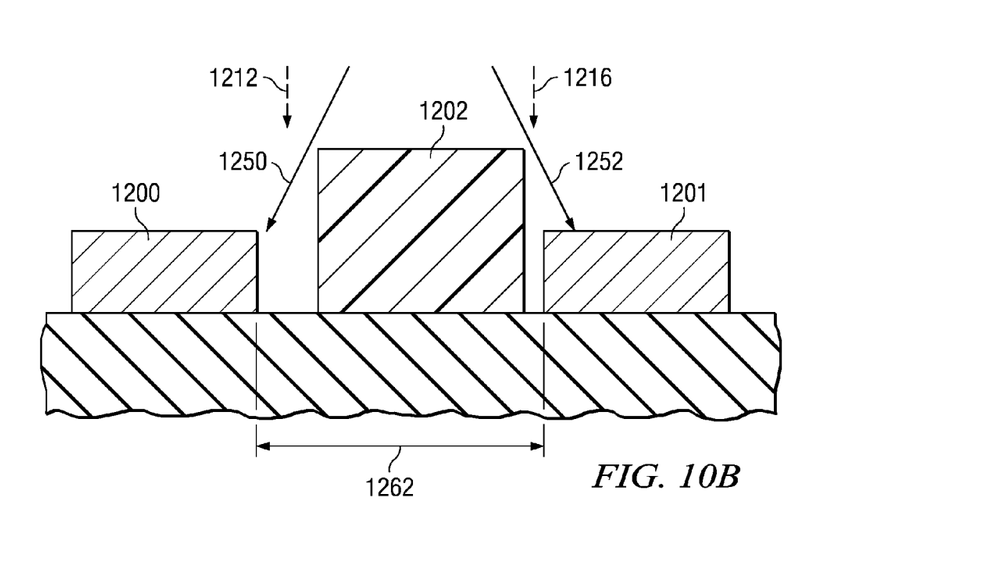
FIG. 10B is an exemplary cross section diagram showing the effect of implant tilt angle for edges of adjacent transistors.

Referring to FIG. 10B, there is an exemplary cross section diagram showing the effect of implant tilt angle for edges of adjacent transistors. The adjacent transistors include gate regions 1200 and 1201 each formed over the substrate. A photoresist mask 1202 is placed between the two gates. The photoresist is shown with some misalignment 1212, 1216 toward the gate 1201. Because of this misalignment, relatively less photoresist exists to block the P-type pocket implant 1250 compared to the implant 1252. For a given opening 1262 between the two gates, a given photoresist CD 1261, a given misalignment or overlay error, and a given pocket implant tilt angle, there is a minimum photoresist height that must exist to ensure successful blocking of both pocket implants 1250 and 1252. In those embodiments of the present invention in which the LDD implants are not are applied with the photoresist mask described in FIG. 4A, 4B, 5, or 6, successful application of the LDD implant is not a consideration in designing the photoresist mask.

Figure 11:
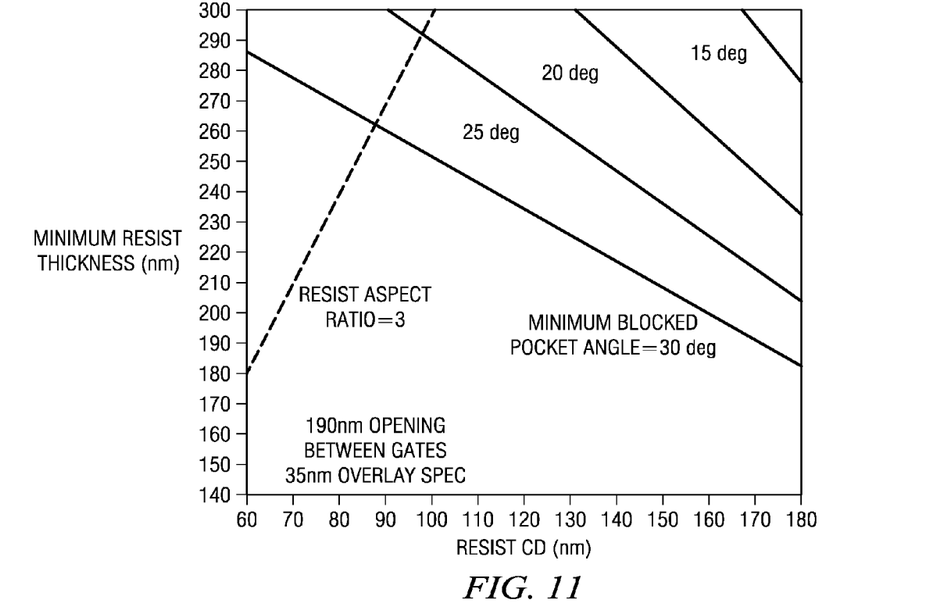
FIG. 11 is a graph showing the minimum resist thickness required to block a pocket implant as a function of the resist CD and the pocket angle for a 190 nm opening between gates and with 35 nm overlay error.
Figure 12:
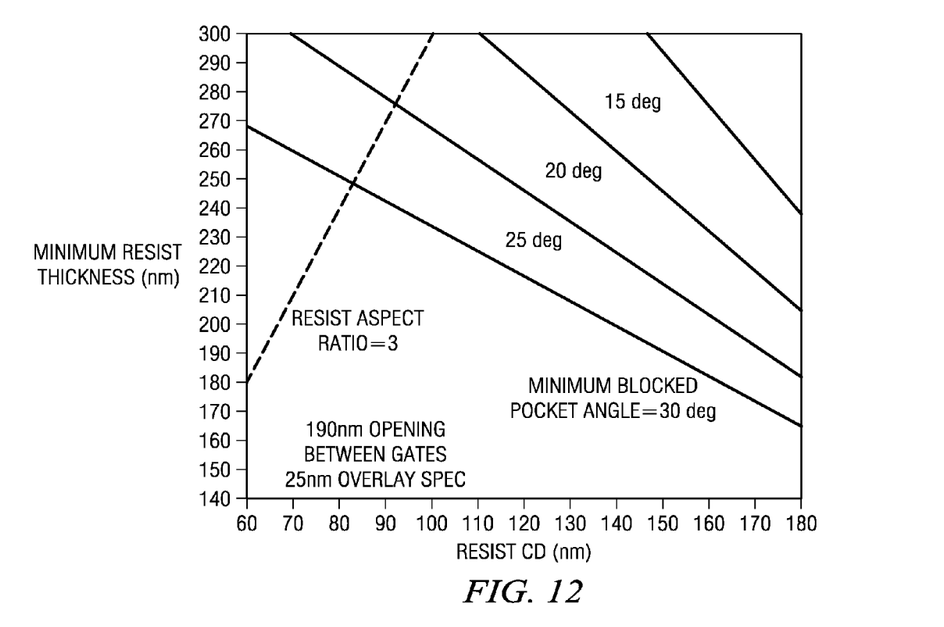
FIG. 12 is a graph showing the minimum resist thickness required to block a pocket implant as a function of the resist CD and the pocket angle for a 190 nm opening between gates and with 25 nm overlay error.
Figure 13:
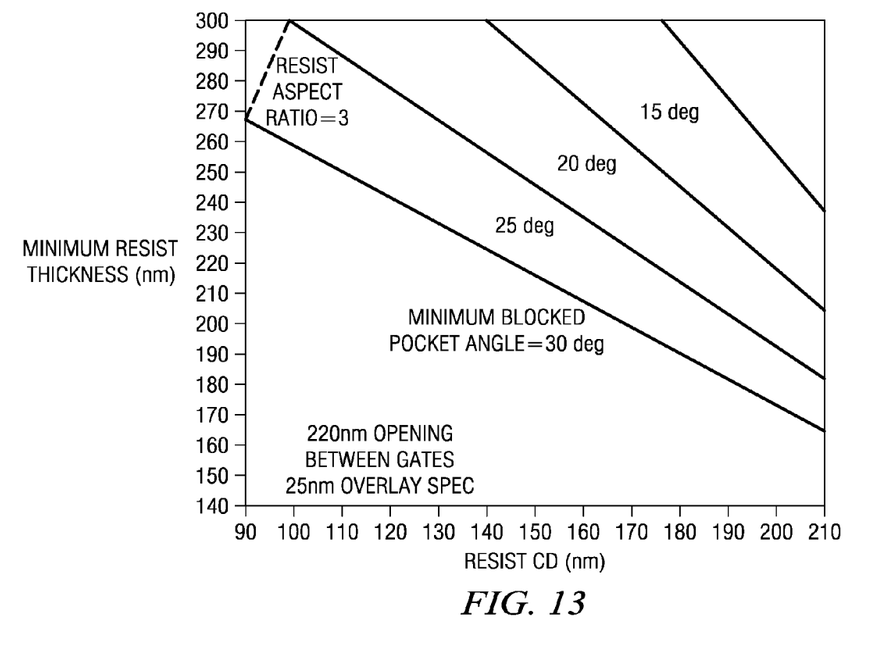
FIG. 13 is a graph showing the minimum resist thickness required to block a pocket implant as a function of the resist CD and the pocket angle for a 220 nm opening between gates and with 25 nm overlay error.

FIGS. 11-13 show graphs of the minimum photoresist height required to block the pocket implants for various misalignment conditions. FIG. 11 is a graph showing minimum photoresist height required to block pocket implants for a 190 nm opening between the gates and with 35 nm misalignment. FIG. 12 is a graph showing minimum photoresist height required to block pocket implants for the same 190 nm opening but with only 25 nm misalignment. FIG. 13 is a graph showing minimum photoresist height required to block the pocket implants for a 220 nm opening between the gates and with 25 nm misalignment.

Figure 14:
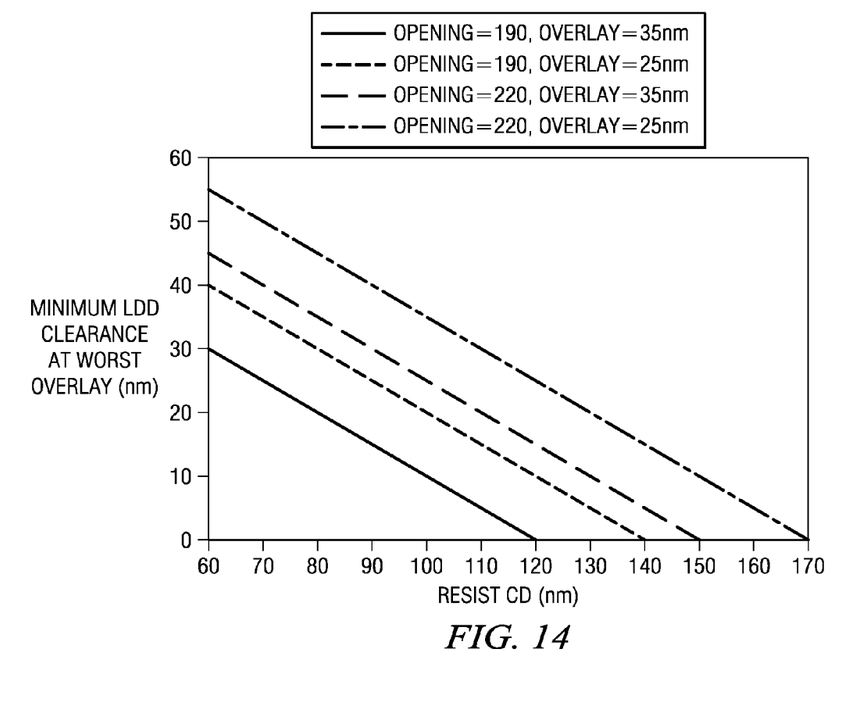
FIG. 14 is a graph showing the minimum LDD clearance for various resist CD's, gate-to-gate opening spaces, and overlay specifications.

In those embodiments of the present invention where LDD implants are applied using the same photoresist mask as the pocket implants, the photoresist mask must not only block the pocket implants but also permit the LDD implants to reach the substrate on both source and drain sides of the gates. Returning to FIG. 10B, because of the misalignment, the clearance for the LDD implant is smaller near the gate 1201 compared to near the gate 1200. For a given opening between the gates, the photoresist CD and the misalignment specification must be set such that the necessary clearance exists for the LDD implant near both gates. The value of the necessary clearance will depend on process details such as the LDD implant dose, the amount of diffusion occurring in subsequent thermal steps, and the design of the heavily-doped source and drain regions in any specific manufacturing process. FIG. 14 shows a graph of the LDD implant clearance as a function of the photoresist CD, the opening between the gates, and the overlay specification. For example, with a resist CD of 110 nm, an overlay specification of 25 nm, and a gate to gate opening of 220 nm, a satisfactory minimum clearance of 30 nm is obtained.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. In view of the foregoing discussion, it is intended that the appended claims encompass any such modifications or embodiments.

What is claimed is:

1. A method of fabricating an integrated circuit having an SRAM memory cell, comprising the steps of:
   forming a gate structure for an access transistor of said SRAM memory cell over a semiconductor body;
   forming a first source/drain region on a bitline side of said gate structure and a second source/drain region on a storage node side of the gate structure;
   implanting a dopant into a pocket region on the storage node side of the access transistor while at least partially blocking the dopant implantation into the pocket region on the bitline side of the access transistor, thereby forming said pocket region having an asymmetrical shape;
   connecting said first source/drain region to a bitline; and
   connecting said second source/drain region to a storage node;
   forming an implant mask over the semiconductor body prior to said step of implanting a dopant;
   using said implant mask, forming a first lightly doped source/drain region on the bitline side and a second lightly doped source/drain region on the storage side; and
   removing said implant mask after said step of implanting a dopant.

2. The method of claim 1, wherein said step of implanting a dopant comprises performing an angled implant using said implant mask such that said dopant is blocked from said bitline side.

3. The method of claim 1, wherein said step of implanting a dopant comprising implanting at azimuth angles of 45°, 135°, 225°, and 315° with respect to one of a width and a length direction of said gate structure.

4. A method of fabricating an integrated circuit having an SRAM memory cell, comprising the steps of:

forming a gate structure for an access transistor of said SRAM memory cell over a semiconductor body;

forming a first implant mask over said semiconductor body;

forming lightly doped source/drain regions on a bitline side of said gate structure of said access transistor and on a storage node side of said gate structure of said access transistor using said first implant mask;

removing said first implant mask;

forming a first source/drain region on said bitline side of said gate structure and a second source/drain region on said storage node side of said gate structure;

forming a second implant mask over said semiconductor body;

implanting a dopant into a pocket region on said storage node side of the access transistor while at least partially blocking the dopant implantation into said pocket region on said bitline side of said access transistor using said second implant mask, thereby forming said pocket region having an asymmetrical shape;

removing said second implant mask;

connecting said first source/drain region to a bitline; and connecting said second source/drain region to a storage node.

* * * * *